United States Patent
Niiyama et al.

(10) Patent No.: US 8,309,988 B2
(45) Date of Patent: Nov. 13, 2012

(54) FIELD EFFECT TRANSISTOR

(75) Inventors: Yuki Niiyama, Tokyo (JP); Takehiko Nomura, Tokyo (JP); Sadahiro Kato, Tokyo (JP)

(73) Assignee: Furukawa Electric Co., Ltd, Tokyo (JP)

( * ) Notice: Subject to any disclaimer, the term of this patent is extended or adjusted under 35 U.S.C. 154(b) by 243 days.

(21) Appl. No.: 12/732,378

(22) Filed: Mar. 26, 2010

(65) Prior Publication Data
US 2010/0244097 A1 Sep. 30, 2010

(30) Foreign Application Priority Data
Mar. 26, 2009 (JP) ................. 2009-076047

(51) Int. Cl.
*H01L 29/78* (2006.01)
(52) U.S. Cl. ......... 257/192; 257/E29.241; 257/E29.242; 257/E29.024
(58) Field of Classification Search .......... None
See application file for complete search history.

(56) References Cited

U.S. PATENT DOCUMENTS

| | | | | |
|---|---|---|---|---|
| 6,028,328 | A * | 2/2000 | Riechert et al. | 257/194 |
| 2006/0108602 | A1* | 5/2006 | Tanimoto | 257/192 |
| 2006/0170003 | A1* | 8/2006 | Saito et al. | 257/189 |
| 2008/0296618 | A1* | 12/2008 | Suh et al. | 257/190 |
| 2010/0032716 | A1* | 2/2010 | Sato et al. | 257/192 |

FOREIGN PATENT DOCUMENTS
WO WO2008114336 * 9/2008

OTHER PUBLICATIONS

W. Huang, T. Khan, T.P. Chow, "Enhancement-Mode n-Channel GaN MOSFETs on p and n-GaN/Sapphire Substrates," 18th International Symposium on Power Semiconductor Devices and ICs (ISPSD) 2006 (Italy), 10-1.
M. Kuraguchi et al., "Normally-off GaN-MISFET with well-controlled threshold voltage," International Workshop on Nitride Semiconductors 2006 (IWN2006), Oct. 22-27, 2006, Kyoto, Japan, WeED1-4.
Wilson R.G. et al., "Redistribution and activation of implanted S, Se, Te, Be, Mg and C in GaN," Journal of Vacuum Science and Technology, A17, 1226 (1999).

* cited by examiner

*Primary Examiner* — Fei Fei Yeung Lopez
(74) *Attorney, Agent, or Firm* — Turocy & Watson, LLP

(57) ABSTRACT

Provided is a GaN based field effect transistor that is capable of normally-off operation, high breakdown voltage and large current. A body electrode 8 is provided on the bottom surface or the top surface of the field effect transistor. When the body electrode 8 is provided on the bottom surface, a p-type GaN layer 4 is provided on a p-type Si substrate 2 via a buffer layer 3 comprising a plurality of AlN layers 31 and GaN layers 32, with the top layer of that buffer layer 3 being a thin AlN layer 31, and the body electrode 8 being formed on the bottom surface of the p-type Si substrate. When the body electrode 8 is provided on the top surface, a p-type GaN layer 4 is provided on a sapphire substrate 21 and an AlGaN layer 13 is provided on the area under the source electrode 5 and drain electrode 6, with the body electrode 8 being provided on top of the AlGaN layer 13. Holes 20 that are generated by an avalanche phenomenon run through the body electrode 8.

19 Claims, 4 Drawing Sheets

FIELD EFFECT TRANSISTOR

CROSS-REFERENCE TO RELATED APPLICATIONS

This application claims priority from Japanese patent application serial No. 2009-076047, filed on Mar. 26, 2009, the entire content of which is incorporated herein by reference.

BACKGROUND OF THE INVENTION

1. Field of the Invention

The present invention relates to a field effect transistor that uses a III-nitride semiconductor, and more particularly to a field effect transistor that realizes normally-off operation, and has high breakdown voltage and large current operation.

2. Description of the Related Art

Due to the intrinsic properties of the material, III-nitride semiconductors such as GaN have higher breakdown voltage and larger current density than that of silicon semiconductors, and are capable of high-temperature operation, which makes them being expected as power devices.

GaN based MOSFETs (Metal Oxide Semiconductor Field Effect Transistors) (refer to non-patent document 1) and AlGaN/GaN based HFETs (Hetero junction Field Effect Transistor) have been generally proposed as field effect transistors that use III-nitrides.

These GaN based field effect transistors have a higher breakdown electric field and higher saturation velocity than that of Si semiconductors or conventional III-V compound semiconductors such as GaAs and InP, so are especially suitable as power devices.

In addition, GaN based MOSFETs are easily capable of normally-Off operation, so when a problem occurs in a power-supply circuit, operation proceeds in a safe direction, thus they are suitable as power devices from the aspect of fail-safe operation as well. In the GaN based MOSFETs that are described in non-patent document 1, a 940 V breakdown voltage was achieved by forming a RESURF (REduced SURface Field) layer on the semiconductor layer that reduces the surface field.

Moreover, the AlGaN/GaN based HFETs that are described in non-patent document 2 are structured with semiconductor layers being stacked on a carrier drifting layer consisted of undoped AlGaN in the order of a barrier layer consisted of an undoped or n-type AlGaN having a lattice constant that is smaller than that of the carrier drifting layer, a threshold control layer consisted of AlGaN having a lattice constant that is the same as that of the carrier drifting layer, and a carrier induced layer consisted of undoped or n-type AlGaN. Generally, normally-off operation is difficult for an AlGaN based HFET, however, by forming a gate electrode in a recess that is formed by removing a part of the carrier induction layer and a part of the barrier layer so that the film thickness of the barrier layer is equal to or less than the critical thickness, normally-off operation is made possible, and by controlling the film thickness of the barrier layer at the atomic layer level, it is possible to keep fluctuation in the threshold voltage small. Also, ON resistance is reduced by providing a carrier induction layer.

In the case of a Si power device, a method is known in which a body electrode is placed in a p$^+$-type layer in order to realize high breakdown voltage. The breakdown voltage can be improved by removing from this body electrode the holes from the electron-hole pairs that are generated by the avalanche phenomenon that occurs when the drain voltage is increased. However, in the case of GaN, selectively forming a high-concentration p$^+$-type layer by a method such as ion implantation method is extremely difficult. In a report of a p-type layer formed by ion implantation, the sheet carrier density of the holes is approximately $7\times10^{12}$ cm$^{-2}$ (refer to non-patent document 3).

Reference Documents: Non-Patent Documents

Non-patent document 1: W. Huang, T. Khan, T. P. Chow, "Enhancement-Mode n-Channel GaN MOSFETs on p and n-GaN/Sapphire Substrates," 18th International Symposium on Power Semiconductor Devices and ICs (ISPSD) 2006 (Italy), 10-1.

Non-patent document 2: M. Kuraguchi et al., "Normally-off GaN-MISFET with well-controlled threshold voltage," International Workshop on Nitride Semiconductors 2006 (IWN2006), Oct. 22-27, 2006, Kyoto, Japan, WeED1-4.

Non-patent document 3: Wilson R. G. et al., "Redistribution and activation of implanted S, Se, Te, Be, Mg and C in GaN," Journal of Vacuum Science and Technology, A17, 1226 (1999).

However, in a power device it is necessary to enable normally-off operation by making the breakdown voltage higher and by making the threshold voltage of the gate electrode higher. For example, in order to be applicable in a power-supply circuit of an automobile, a drain breakdown voltage of approximately 1200 V, and a threshold voltage of +3 V or greater are required. The GaN based MOSFET of non-patent document 1 has a breakdown voltage of 940 V; however, for use in a power-supply circuit of an automobile, there is a problem in that even higher breakdown voltage is necessary.

Moreover, the AlGaN/GaN based HFET of non-patent document 2 enables normally-off operation, and is capable of controlling the threshold voltage such that there is little fluctuation; however, the threshold voltage is only about +1 V, which is less than the required +3 V threshold voltage for a power device.

Furthermore, in order to realize a GaN based power device by using a method in which an electrode is disposed in a p$^+$-type layer and holes are removed as in an Si power device, it is necessary to form a p$^+$-type layer having a sheet carrier density of $1\times10^{15}$ cm$^{-2}$ at least, however, there is a problem in that a sheet carrier density of $7\times10^{12}$ cm$^{-2}$ of a p$^+$-type layer that can be formed in GaN as given in non-patent document 3 is too low. Also, it is even more difficult to selectively form a high-concentration p$^+$-type layer.

In consideration of the problems described above, the object of the present invention is to provide a III-nitride semiconductor field effect transistor that is capable of normally-off operation, high breakdown voltage and large current.

SUMMARY OF THE INVENTION

It is an object of the present invention to at least partially solve the problems in the conventional technology. In order to solve the problems described above, the present invention is a field effect transistor that uses a III-nitride semiconductor with a body electrode being formed on either the top surface or the bottom surface of that III-nitride semiconductor. In so doing, it is possible to easily realize normally-off operation. With the present invention, it is possible to provide a field effect transistor that is capable of normally-off operation, high breakdown voltage and large current operation.

The above and other objects, features, advantages and technical and industrial significance of this invention will be better understood by reading the following detailed descrip-

DETAILED DESCRIPTION OF THE PREFERRED EMBODIMENTS

Detailed embodiments of the present invention will be explained based on the accompanying drawings. In each of the embodiments explained, the same reference numbers will be used for the same parts, and any redundant explanation will be omitted.

First Embodiment

Figure 1:
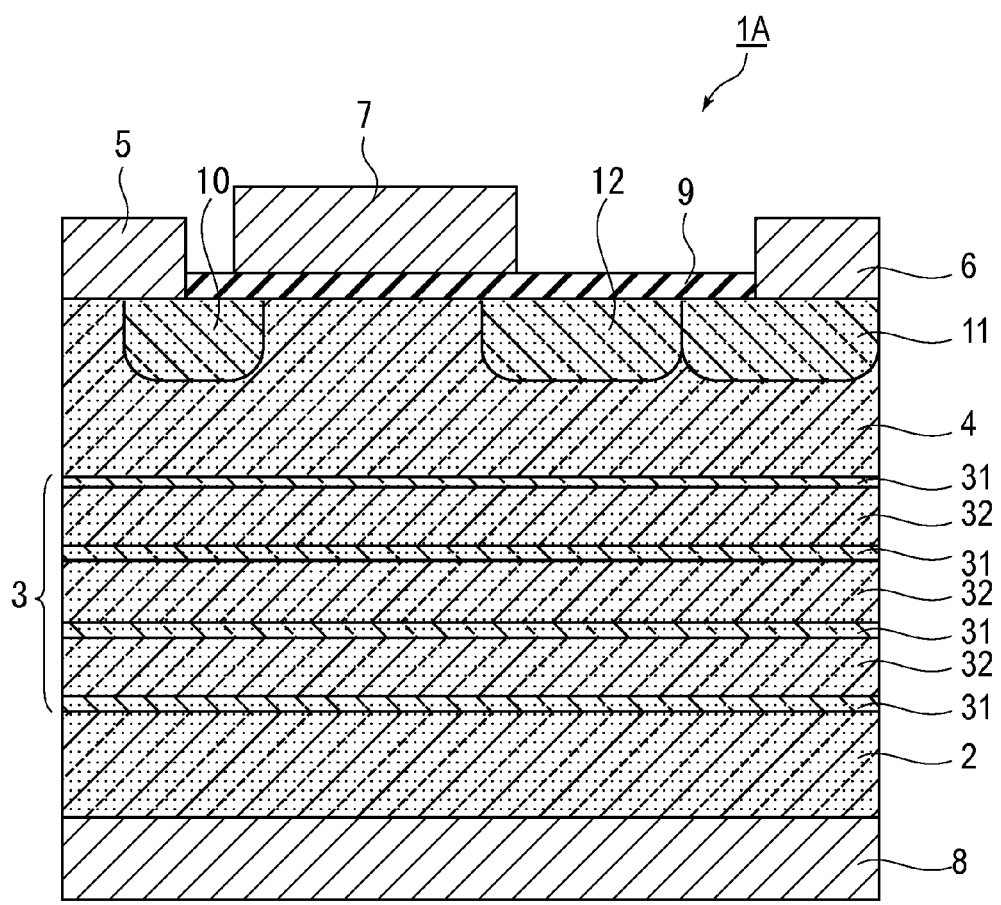
FIG. 1 is a cross-sectional drawing showing the construction of a field effect transistor 1A that uses a III-nitride (GaN) of a first embodiment of the present invention.

FIG. 1 is a cross-sectional drawing showing the construction of a field effect transistor 1A that uses a III-nitride (GaN) of a first embodiment of the present invention. In this embodiment GaN and AlN are used as the III-nitride.

This field effect transistor 1A comprises a p-type Si substrate 2 as the substrate, on which a semiconductor layer comprising a p-type GaN layer 4 is formed via a buffer layer 3. A body electrode 8 is provided on the bottom surface of the p-type Si substrate 2.

Moreover, n⁺-type GaN layers 10, 11, which are contact layers, are formed in regions on the surface of the p-type GaN layer 4 that come in contact with the bottom of a source electrode 5 and drain electrode 6. There is also a RESURF layer 12 for reducing the electric field concentration provided in a region on the surface of the p-type GaN layer 4 that is underneath the section between a gate electrode 7 and drain electrode 6. Furthermore, a $SiO_2$ layer 9, which is a gate oxidation film, is formed on top of the p-type GaN layer 4 in a region between the source electrode 5 and gate electrode 6, and the gate electrode 7 is provided on top of the $SiO_2$ layer 9.

The buffer layer 3 has stacked structure, for example, comprises a plurality of alternately formed AlN layers 31 and GaN layers 32, and this buffer layer 3 reduces the differences in the lattice constants and thermal expansion coefficients of Si and GaN when forming the p-type GaN layer 4 on the p-type Si substrate 2. In addition to AlN and GaN that are shown in FIG. 1, BN, or compounds made through combinations with these III-nitrides, such as AlGaN and BGaN, can also be used as the buffer layer 3.

The top layer of the buffer layer 3 is an AlN layer 31, and the top AlN layer 31 is formed such that it is thinner than the other AlN layers 31 of the buffer layer 3. In other words, the thickness of the top AlN layer 31 is at least 1 nm but not more than 40 nm. As will be described later, by making this top AlN layer thin and providing a body electrode on the bottom surface of the p-type Si substrate, it becomes possible to cause the holes that occur in the p-type GaN semiconductor layer 4 or in the RESURF layer 12 due to the avalanche phenomenon to permeate through the buffer layer 3 by the tunnel effect and be removed. By doing so, the breakdown voltage can be improved.

Next, the functional effect of the field effect transistor 1A of this first embodiment having the structure shown in FIG. 1 will be explained.

As shown in FIG. 1, by forming the body electrode 8 on the bottom surface of the p-type Si substrate 2 and making the film thickness of the top AlN layer 31 of the buffer layer 3 thin, the breakdown voltage of the field effect transistor 1A can be improved by removing holes that are generated by the avalanche phenomenon from the body electrode via the buffer layer 3 and p-type Si substrate 2.

When a high drain voltage $V_d$ (for example $V_d$=1000 V) is applied under the gate voltage ($V_g$) of 0 V, electric field concentrates at the RESURF layer 12 near the gate electrode 7, and in the contact layer 11 near the gate electrode 7, so that electron-hole pairs are generated by the avalanche phenomenon. The generated electrons escape to the drain electrode 6, however, the holes accumulate in the p-type GaN layer 4. In order to increase the breakdown voltage it is necessary to remove these holes to the outside.

In the case of a conventional field effect transistor that uses a Si semiconductor, holes can be actively removed by forming a body electrode on the bottom surface of a p+-type Si substrate. However, as shown in FIG. 1, in the case of the field effect transistor 1A of this first embodiment of the present invention that uses a group III nitride (GaN), in order to form a p-type GaN layer 4 on the p-type Si substrate 2, a buffer layer 3 is formed that reduces the differences between the lattice constants and thermal expansion coefficients of Si and GaN.

In order to remove the holes that are generated due to the avalanche phenomenon through the buffer layer 3, p-Si substrate 2 and the body electrode 8, the film thickness of the top AlN layer 31 of the buffer layer 3 is made thin so that the holes pass through the AlN layer 31 due to the quantum tunneling effect.

Next, removal of the holes by this tunnel effect will be explained with reference to FIGS. 3A and 3B.

Figure 3A:
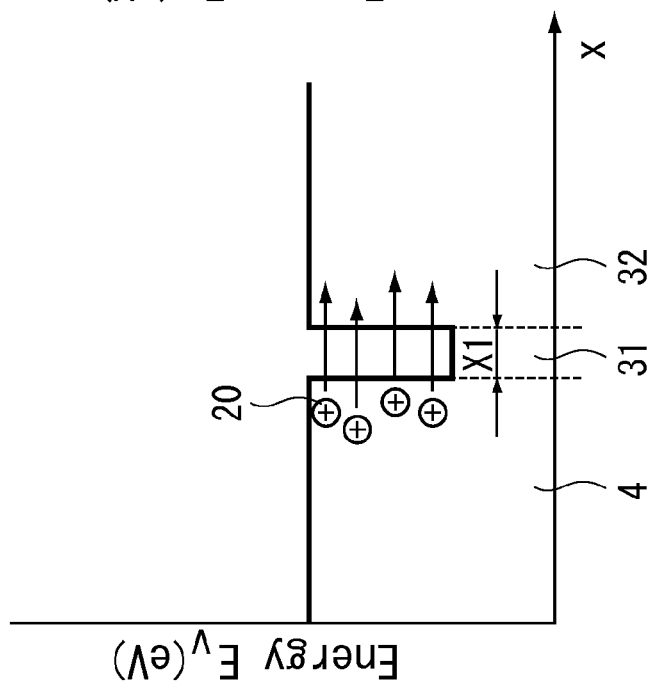
FIG. 3A and FIG. 3B are drawings explaining a method of removing holes through a tunnel effect.
Figure 3B:
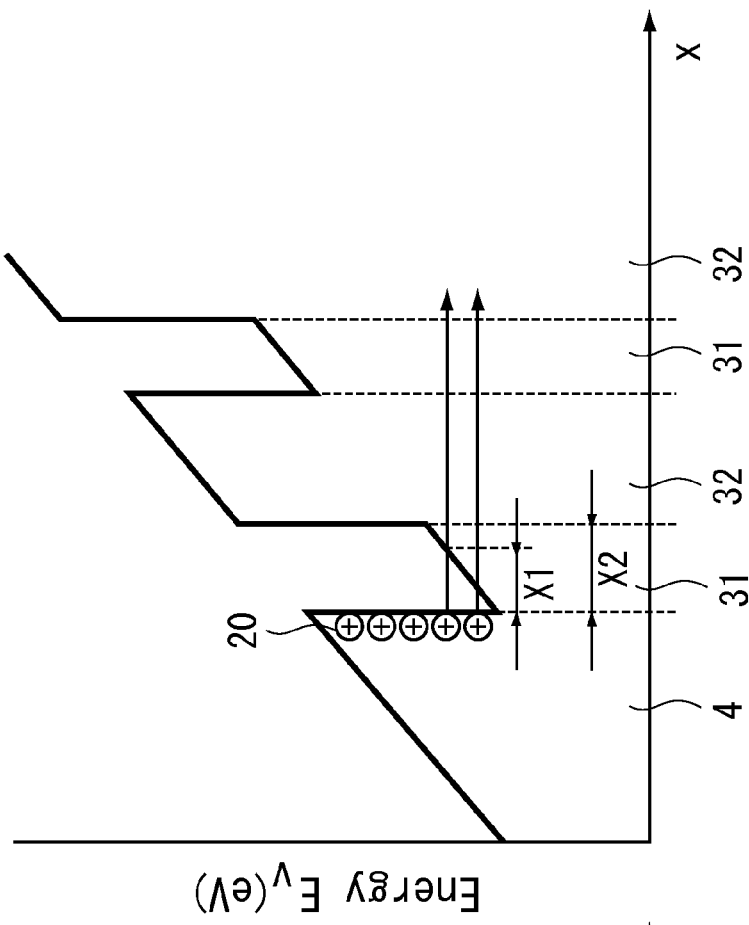

FIG. 3A is a drawing that schematically shows the energy structure $E_v$ of the valence bands of the p-type GaN layer 4, the top AlN layer 31 of the buffer layer 3 and the GaN layer 32 underneath that AlN layer 31.

Holes 20 that are generated in the p-type GaN layer 4 do not enter into the buffer layer 3 due to the energy barrier at the boundary between the p-type GaN semiconductor layer 4 and the AlN layer 31. However, by making the film thickness X1 of the AlN layer 10 nm or less, for example, the holes 20 can then pass through the energy barrier at the boundary between the p-type GaN layer 4 and AlN layer 31 due to a quantum tunneling effect.

However, the quantum tunneling effect actually occurs even when the film thickness of the AlN layer 31 is not 10 nm or less. FIG. 3B is a drawing that schematically shows the energy structure of the valence bands of the p-type GaN layer 4, the top AlN layer 31 of the buffer layer 3 and the GaN layer 32 underneath that AlN layer 31 for the case when a drain voltage $V_d$ (for example, $V_d$=1000 V) is applied between the drain and source.

The source electrode 5 and body electrode 8 are grounded, the voltage $V_s$ of the source electrode 5 and the voltage $V_b$ of the body electrode 8 are 0, and only the drain voltage $V_d$ is high, so the energy structure $E_v$ is inclined. The film thickness X2 of the top AlN layer 31 of the buffer layer 3 is taken to be 40 nm, for example. As shown in FIG. 3B, due to the drain voltage $V_d$, the energy structure $E_v$ is inclined, so the energy structure of the band valence of the AlN layer 31 is also inclined, and even though the film thickness X2 of the top AlN layer 31 is X2=40 nm, a triangular potential portion exists that is equivalent to X1=10 nm where the tunnel effect occurs. This makes it possible for the holes 20 to pass through the top AlN layer 31.

In addition, due to the incline of the energy structure $E_v$, the holes 20 that passed through the top AlN layer 31 can easily pass through the GaN layers 32 and AlN layers 31 that are below that top AlN layer 31 and reach the p-type Si substrate 2 where they can then be removed from the body electrode 8. Therefore, it is necessary to make the film thickness of the top AlN layer 31 as thin as possible (at least 1 nm but not more than 40 nm), however, the film thickness of the other AlN layers 31 are not limited to this range and can be thick.

As described above, by providing the body electrode 8 on the bottom surface of the p-type Si substrate, and controlling the film thickness of the top AlN layer 31 of the buffer layer 3 such that it is 40 nm or less, the holes that are generated by the avalanche phenomenon can be removed, making it possible to improve the breakdown voltage of the III-nitride (GaN) field effect transistor.

Moreover, by introducing a RESURF layer 12 in a region of the surface of the p-type GaN layer 4 that is underneath the area between the gate electrode (G) 7 and drain electrode 6 in order to reduce surface field concentration, it is possible to improve breakdown voltage by reducing the electric field that is concentrated in the SiO$_2$ layer 9 near the drain electrode 6 when a high drain voltage $V_d$ (for example, $V_d$=1000 V) is applied.

As described above, the field effect transistor 1A of this first embodiment of the present invention is capable of normally-off operation, as well as can be operated with a high breakdown voltage.

(Manufacturing Method of the Field Effect Transistor 1A)

Next, an example of the manufacturing method for the field effect transistor 1A is explained.

(Crystal Growth Step)

First, a 40-nm-thick AlN layer is grown on to a surface of a p-type Si substrate 2 by a method such as MOCVD (Metal Organic Chemical Vapor Deposition). A 200-nm-thick GaN layer is next grown on a surface of the AlN layer, followed by further growing a 20 nm thick AlN layer, and by repeating this 12 times the buffer layer 3 is formed.

Next, a 1.5-μm-thick GaN layer doped with Mg is grown to form the p-type GaN layer 4. The concentration of the Mg dopant is controlled, for example, to be $1\times10^{17}$ cm$^{-3}$. Next, a 50 nm-thick GaN layer that is doped with Si is grown. The concentration of the Si dopant is controlled, for example, to be $7\times10^{17}$ cm$^{-3}$.

Instead of the MOCVD method, methods such as the HVPE (Hydride Vapor Phase Epitaxy) method and MBE (Molecular Beam Epitaxy) method can also be used.

(Device Isolation Step)

Next, photoresist is applied to the surface of the p-type GaN layer 4 and patterned for separating elements through exposure and developing processes. The p-type GaN layer is then etched to a depth of 200 nm using a dry etching apparatus such as an ICP (Inductively Coupled Plasma) or RIE (Reactive Ion Etching) apparatus, after which the photoresist is removed using acetone to complete isolation of each device on the wafer.

(Gate Oxide Film Deposition Step)

Next, a 60 nm thick SiO$_2$ layer is deposited over the entire surface of the p-type GaN layer 4, which has been isolated each device, by the PECVD (Plasma Enhanced Chemical Vapor Deposition) method, to form a SiO$_2$ layer 9, which is the gate oxide film.

(Ohmic Electrode Formation Step)

Next, opening sections for the source electrode 5 and drain electrode 6 are formed in the SiO$_2$ layer 9. These opening sections are formed by the same photoresist application, exposure, developing, etching and photoresist removal processes as performed when separating elements step. The p-type GaN layer 4 is exposed at the two opening sections, and ohmic electrodes made of Ti/Al, for example, are formed on this p-type GaN layer 4 as a source electrode 5 and drain electrode 6. As long as an ohmic contact is possible, the electrode material can be something other than Ti/Al.

(Gate Electrode Formation Step)

Next, a gate electrode 7 is formed. First, as electrode material, poly-Si (poly-crystalline Si) is deposited over the entire top surface of the elements by a method such as LPCVD (Low Pressure CVD) or sputtering. Next, the elements are heat-treated in a thermal diffusion furnace, which is filled with POCl$_3$ gas, for 20 minutes at 900° C. to dope the elements with a phosphorus (P) impurity. Application of photoresist, exposure, developing, etching and removal of photoresist are then performed on the P doped poly-Si so that poly-Si remains in the gate section between the source electrode 5 and drain electrode 6. In doing so, the gate electrode 7 is formed.

Doping of P into the poly-Si can also be performed by vapor depositing P onto the poly-Si and performing thermal diffusion. Moreover, Au, Pt, Ni and the like can also be used for the gate electrode.

(Body Electrode Formation Step)

An AuGa alloy is used as a body electrode 8, and is vapor deposited on the bottom surface of the p-Si substrate 2.

Through the manufacturing process described above, the III-nitride (GaN) field effect transistor 1A shown in FIG. 1 that is capable of normally-off operation and high breakdown voltage is manufactured.

Second Embodiment

Figure 2:
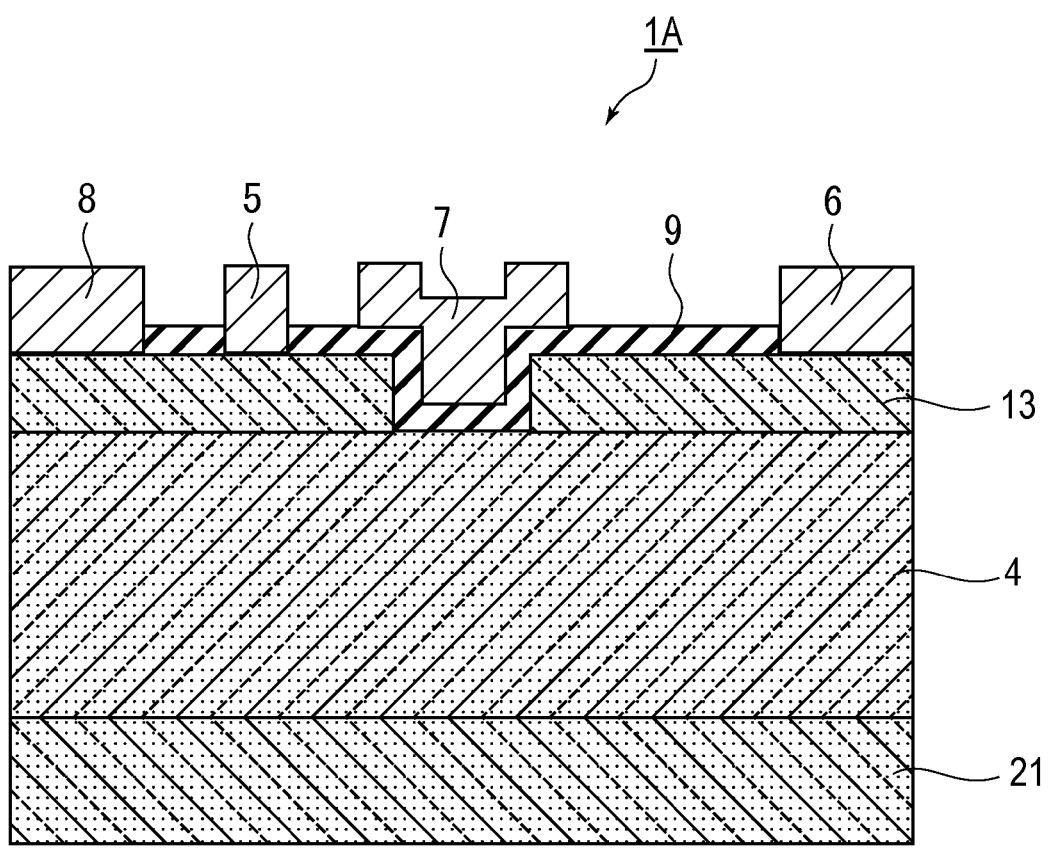
FIG. 2 is a cross-sectional drawing showing the construction of a field effect transistor 1B that uses a III-nitride (GaN) of a second embodiment of the present invention.

FIG. 2 is a cross-sectional drawing showing the structure of a field effect transistor 1B of a second embodiment of the present invention. In the case of the III-nitride semiconductor field effect transistor 1B, the body electrode 8 is formed on the top surface of the III nitride semiconductor field effect transistor 1B.

As shown in FIG. 2, the III nitride semiconductor field effect transistor 1B uses a sapphire substrate 21, with a p-type GaN layer 4 being formed on the sapphire substrate 21. Furthermore, an AlGaN layer 13 is formed on a top surface of the p-type GaN layer 4 underneath a source electrode 5, drain electrode 6 and body electrode 8. Here, the film thickness of this AlGaN layer 13 is approximately 20 nm. The band gap energy of AlGaN is larger than that of GaN, however, the film thickness is thin, so electrons from a metal electrode permeate to the p-type GaN layer 4 due to the tunnel effect, and it is possible to keep the resistance at the boundary between the electrode and AlGaN layer, in the AlGaN layer 13 and at the boundary between the AlGaN layer 13 and p-type GaN layer 4 to a minimum, and to obtain large current due to the low ON resistance.

The source electrode 5, drain electrode 6 and body electrode 8 are formed directly on the AlGaN layer 13. On the other hand, a SiO2 film is formed as a gate oxide film in the areas on the AlGaN layer where the source electrode 5, drain electrode 6 and body electrode 8 are not formed, and a gate electrode 7 is formed on this SiO$_2$ film on the p-type GaN layer 4 using gate recess structure. The AlGaN/GaN region between the gate electrode 7 and drain electrode 6 functions as a RESURF (REduced SURface Field) layer, and by having a certain resistance causes a voltage drop, which has the effect of reducing the electric field that is generated in the $SiO_2$ layer 9, which is a gate oxide film.

Next, the functional effect of the III nitride semiconductor field effect transistor 1B of this second embodiment having the structure shown in FIG. 2 will be explained.

As shown in FIG. 2, by forming a body electrode 8 on the AlGaN layer 13 on the p-type GaN layer 4, it is possible to improve the breakdown voltage of the III nitride semiconductor field effect transistor 1B by removing holes that are generated by the avalanche phenomenon.

When the gate voltage $V_g$ of the field effect transistor 1B is 0 V, and a high drain voltage $V_d$ (for example, $V_d$=1000 V), electric field concentration points occur in the p-type GaN layer 4 near the gate electrode 7 side portion of the drain electrode 6 and the drain electrode side portion of the gate electrode 7, and electron-hole pairs are generated by the avalanche phenomenon. The electrons of the generated electron-hole pairs escape to the drain electrode 6.

The body electrode 8 is formed on the AlGaN layer 13, and by providing this body electrode 8, the energy inclines from the side of the drain electrode 6 of the p-type GaN layer 4 toward the side of the body electrode 8, so the holes flow to the side of the body electrode 8, and by making the film thickness of the AlGaN layer 13 thin, the holes permeate toward the body electrode 8 and are removed. In this way, the holes that are generated by the avalanche phenomenon can be removed from the body electrode 8 and the breakdown voltage can be improved.

As described above, with the field effect transistor 1B of this second embodiment of the present invention, it is possible to obtain a field effect transistor having normally-off operation, a high breakdown voltage and high current.

(Manufacturing Method for Field Effect Transistor 1B)

Next, an example of the manufacturing method for manufacturing the field effect transistor 1B of this second embodiment will be explained.

(Crystal Growth Step)

First, with the substrate temperature of the sapphire substrate 21 at 1000° C., a 1 μm thick GaN layer is grown on the sapphire substrate 21 by the MOCVD method, for example. Next, the substrate temperature ramped to 1050° C., and Mg doping is performed to grow a 2 μm thick p-type GaN layer 4. Mg is used as the p-type dopant, and the Mg concentration is controlled at $1 \times 10^{17}$ cm$^{-3}$. A 25 nm thick AlGaN layer (Al composition 25%) is then grown. By doing so, the AlGaN layer 13 is formed.

Instead of the MOCVD method, methods such as the HVPE method and MBE method can also be used. Also, SiC, $ZrB_2$ and the like can be used, for example, as the substrate for growing crystals. Moreover, Be, Zn, C and the like can be used instead of Mg as the dopant.

(Element Separation Step)

Next, photoresist is applied to the surface of the AlGaN layer 13, after which patterning for element separation is performed by exposure and developing processes. Using a dry etching apparatus such as an ICP or RIE apparatus, the AlGaN layer 13 and Mg doped p-type GaN layer 4 is etched to a depth of 200 nm, then the photoresist is removed using acetone to complete element separation.

(Gate Recess Formation Step)

Next, a recess structure is formed for forming the gate. In other words, first, a 300 nm thick layer of $SiO_2$ is deposited on the p-type GaN layer 4 by PCVD (Plasma CVD). Then the $SiO_2$ in the gate region is etched using BHF (Buffer Hydrogen Fluoride) to form an opening.

Next, an ICP dry etching apparatus is used to completely etch the AlGaN layer, after which 100 nm of the p-type GaN layer 4 is etched. The $SiO_2$ on the p-type GaN layer 4 is then completely removed using BHF.

(Gate Oxide Film Deposition Step)

Next, a 60 nm thick $SiO_2$ layer is deposited over the entire surface of the semiconductor layers for which element separation has been completed (p-type GaN layer 4, AlGaN layer 13) by the PECVD method, to form a $SiO_2$ layer 9 that will become the gate oxide film.

(Ohmic Electrode Formation Step)

Next, opening sections are formed in the $SiO_2$ layer 9, which is the gate oxide film, for the source electrode 5, drain electrode 6 and body electrode 8. These opening sections are formed by the same photoresist application, exposure, developing, etching and photoresist removal processes as performed when isolating each device.

The AlGaN layer 13 is exposed at these three opening sections, and ohmic electrodes made of Ti/Al, for example, are formed in the source electrode 5 region and drain electrode 6 region as the source electrode 5 and the drain electrode 6. As long as an ohmic contact is possible, a material other than Ti/Al can be used as the electrode material. Moreover, Ni/Au, for example, is vapor-deposited in the body electrode 8 region as the body electrode 8.

(Gate Electrode Formation Step)

Next, the gate electrode 7 is formed. First, as electrode material, poly-Si is deposited over the entire top surface of the elements by a method such as LPCVD or sputtering. Next, the elements are heat treated in a thermal diffusion furnace, which is filled with $POCl_3$ gas, for 20 minutes at 900° C. to dope the elements with a P impurity. Application of photoresist, exposure, developing, etching and removal of photoresist are then performed on the P doped poly-Si so that poly-Si remains in the gate section between the source electrode 5 and drain electrode 6. In doing so, the gate electrode 7 is formed.

Doping of P into the poly-Si can also be performed by vapor depositing P onto the poly-Si and performing thermal diffusion. Moreover, Au, Pt, Ni and the like can also be used for the gate electrode.

The III-nitride (GaN) field effect transistor 1B as shown in FIG. 2 is manufactured using the manufacturing process described above.

EXAMPLE

Test results of the breakdown voltage are explained below using an example of the III-nitride (GaN) field effect electrode of the second embodiment of the present invention and a comparative example.

(Crystal Growth Step)

With the substrate temperature of the sapphire substrate 21 at 1000° C., a 1-μm-thick p-type GaN layer 4 was grown on the sapphire substrate 21 by the MOCVD method, after which the substrate temperature was raised to 1050° C. and a 2-μm-thick Mg doped GaN layer was formed. Mg was used as the p-type dopant, and the Mg concentration was $1 \times 10^{17}$ cm$^{-3}$. Next, a 25-nm-thick AlGaN layer (Al composition 25%) was grown to form the AlGaN layer 13.

(Device Isolation Step)

Next, photoresist was applied to the surface of the AlGaN layer 13, and patterning for device isolation was performed by exposure and developing processes, after which a dry etching apparatus was used to etch the AlGaN layer 13 and Mg doped p-type GaN layer 4 to a depth of 200 nm. The photoresist was then removed using acetone.

(Gate Recess Formation Step)

Next, a 300 nm thick layer of $SiO_2$ was deposited on the p-type GaN layer 4 by the PCVD method in order to form a recess structure for the gate, and an opening was formed by etching the $SiO_2$ of the gate region using BHF. The entire AlGaN layer was then etched using an ICP dry etching apparatus, after which 100 nm of the p-type GaN layer 4 was etched and the $SiO_2$ on the p-type GaN layer 4 was removed using BHF.

(Gate Oxide Film Deposition Step)

Next, a 60 nm thick $SiO_2$ layer was deposited over the entire surface of the p-type GaN layer 4, for which element separation was completed, to form a $SiO_2$ layer 9, which is the gate oxide film.

(Ohmic Electrode Formation Step)

Next, by performing photoresist application, exposure, developing, etching and photoresist removal processes, opening sections were formed in the $SiO_2$ layer 9, which is the gate oxide film, for the source electrode 5, drain electrode 6 and body electrode 8. Ohmic electrodes made of Ti/Al were formed in the source electrode 5 region and drain electrode 6 region as the source electrode 5 and drain electrode 6, and Ni/Au was vapor deposited in the body electrode 8 region as the body electrode 8.

(Gate Electrode Formation Step)

Next, poly-Si, which is the electrode material, was deposited over the entire surface of the elements by a method such as LPCVD or sputtering, then heat treated in a thermal diffusion oven filled with $POCl_3$ gas for 20 minutes at 900° C., and doped with P as an impurity.

Processes of photoresist application, exposure, developing, etching and photoresist removal were performed on the P doped poly-Si so that poly-Si remained in the gate section between the source electrode 5 and the drain electrode 6, and the gate electrode 7 was formed.

During manufacturing of the III-nitride semiconductor field effect transistor 1B described above that uses a III-nitride semiconductor (GaN), III-nitride semiconductor (GaN) field effect transistors having varying channel lengths were manufactured, and the breakdown voltages were measured.

Comparative Example

A field effect transistor 1B that corresponds to that of the example was manufactured without a body electrode 8. In other words, using the same method as was used for the example, the processes of crystal growth, element separation, gate recess formation, and gate oxide film deposition were performed.

Next, in the process of forming ohmic electrodes, except for the body electrode 8, the source electrode 5 and drain electrode 6 were formed by the same method as for the example. Finally, the gate electrode 7 was formed by the same method as for the example.

Moreover, field effect transistors that use a III-nitride Semiconductor (GaN) and have varying channel lengths were manufactured in the same way as the example, and the breakdown voltages were measured.

Figure 4:
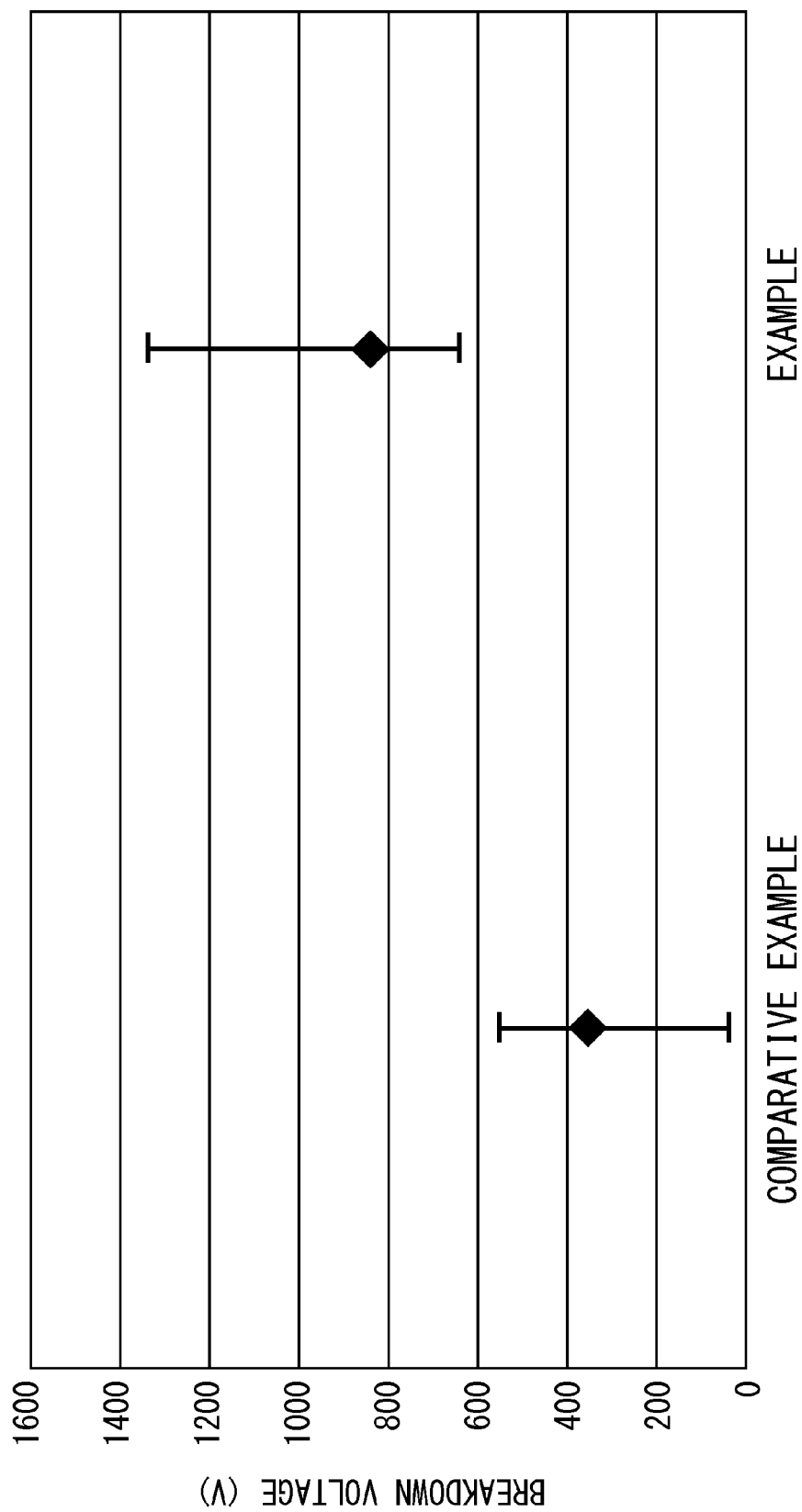
FIG. 4 is a drawing showing the measurement results of the breakdown voltage of the field effect transistor 1B that uses a III-nitride (GaN) of the second embodiment of the present invention.

FIG. 4 is a drawing showing the measurement results of the breakdown voltages (width and central value of the breakdown voltage) of each of the field effect transistors of the example and comparative example. The example provided with a body electrode obtained a high breakdown voltage, and it was confirmed that the breakdown voltage is improved by providing a body electrode. Particularly, when there is a body electrode, the central value was 850 V or greater, and a maximum breakdown voltage of 1350 V was obtained. On the other hand, with the comparative example, the central value of the breakdown voltage of the field effect transistor was 360 V, and even the maximum value was less than 600 V.

As was described above, by providing a body electrode, a field effect transistor that uses a group III nitride (GaN) and having a high breakdown voltage is possible. Moreover, with the field effect transistors 1A and 1B of the embodiments described above, it is possible to obtain field effect transistors having normally-off operation, high breakdown voltage and high current.

Although the invention has been described with respect to specific embodiments for a complete and clear disclosure, the appended claims are not to be thus limited, but are to be construed as embodying all modifications and alternative constructions that may occur to one skilled in the art that fairly fall within the basic teaching herein set forth.

What is claimed is:

1. A field effect transistor comprising:
a first layer that comprises a p-type III-nitride semiconductor; and
a second layer that comprises a III-nitride semiconductor having a band gap energy that is larger than that of said first layer, and having a thickness that is at least 1 nm but not greater than 40 nm;
a first contact layer formed in a first region of the first layer and in contact with a source electrode;
a second contact layer formed in a second region of the first layer and in contact with a drain electrode;
a reduced surface field layer formed in a third region of the first layer and between the source electrode and the drain electrode; and
a gate electrode formed between the source electrode and the drain electrode,
wherein a body electrode is formed on the opposite side of said second layer from said first layer to remove holes that occur in the first layer by permeating through the second layer by a tunnel effect, and
wherein a bottom surface of the source electrode is in contact with the first layer and the first contact layer.

2. The field effect transistor of claim 1 further comprising a substrate that consists of p-type silicon, wherein
said first layer and said second layer are provided on one surface of said substrate, and
said body electrode is formed on the other surface of said substrate.

3. The field effect transistor of claim 2 further comprising a buffer layer that is provided between said substrate and said first layer and is constructed of a plurality of layers comprising a III-nitride semiconductor; wherein
each layer of said buffer layer comprises AlN and/or GaN and/or BN, or comprises a compound of combinations of AlN, GaN and BN; and
the top layer of said buffer layer is said second layer that comprises AlN.

4. The field effect transistor of claim 1 comprising
a sapphire substrate;
a p-type GaN layer that is formed on said substrate; and
an AlGaN layer that is formed on said p-type GaN layer; wherein
a body electrode is formed directly on said AlGaN layer.

5. A field effect transistor comprising:
a first layer that comprises a p-type III-nitride semiconductor;

a second layer that comprises a III-nitride semiconductor having a band gap energy that is larger than that of said first layer, and having a thickness that is at least 1 nm but not greater than 40 nm;

a body electrode formed on the opposite side of said second layer from said first layer;

a first contact layer formed in a first region of the first layer and in contact with a source electrode;

a second contact layer formed in a second region of the first layer and in contact with a drain electrode;

a reduced surface field layer formed in a third region of the first layer and between the source electrode and the drain electrode; and a gate electrode formed between the source electrode and the drain electrode, wherein a bottom surface of the source electrode is in contact with the first layer and the first contact layer.

6. The field effect transistor of claim 5, wherein the first region and the second region are formed on a surface of the first layer.

7. The field effect transistor of claim 5, wherein the source electrode and the body electrode are grounded electrodes.

8. The field effect transistor of claim 5, wherein a bottom surface of the drain electrode is in contact with the second contact layer.

9. The field effect transistor of claim 5, wherein the reduced surface field layer is in contact with the second contact layer.

10. The field effect transistor of claim 5, wherein the reduced surface field layer reduces an electric field concentration in the third region.

11. The field effect transistor of claim 5, wherein the reduced surface field layer is formed on a surface of the first layer.

12. The field effect transistor of claim 5, wherein the body electrode at least one of:
   removes holes that occur in the first layer by permeating through the second layer by a tunnel effect; or
   removes other holes that occur in the reduced surface field layer by permeating through the second layer by the tunnel effect.

13. The field effect transistor of claim 5 further comprising:
   a third layer formed on the first layer, the first contact layer, the second contact layer and the reduced surface field layer.

14. The field effect transistor of claim 13, wherein the third layer is a gate oxidation film.

15. The field effect transistor of claim 13, wherein the source electrode is in contact with the first layer, the first contact layer and the third layer.

16. The field effect transistor of claim 13, wherein the drain electrode is in contact with the second contact layer and the third layer.

17. The field effect transistor of claim 13, wherein the gate electrode is formed on a top surface of the third layer.

18. The field effect transistor of claim 5, wherein the second layer is an AlN buffer layer.

19. A field effect transistor comprising:
   a first layer that comprises a p-type III-nitride semiconductor;
   a second layer that comprises a III-nitride semiconductor having a band gap energy that is larger than that of said first layer, and having a thickness that is at least 1 nm but not greater than 40 nm; and
   a body electrode formed on the opposite side of said second layer from said first layer;
   a first contact layer formed in a first region of the first layer and in contact with a source electrode;
   a second contact layer formed in a second region of the first layer and in contact with a drain electrode;
   a reduced surface field layer formed in a third region of the first layer and between the source electrode and the drain electrode; and
   a gate electrode formed between the source electrode and the drain electrode,
   wherein a principal current is exclusively applied between the source electrode and the drain electrode formed on the first layer, and
   wherein a bottom surface of the source electrode is in contact with the first layer and the first contact layer.

* * * * *